United States Patent [19]

Herron et al.

[11] Patent Number: 4,598,107
[45] Date of Patent: Jul. 1, 1986

[54] STEPWISE/ULTIMATE DENSITY MILLING

[75] Inventors: Lester W. Herron; Robert W. Nufer, both of Hopewell Junction, N.Y.

[73] Assignee: International Business Machines Corporation, Armonk, N.Y.

[21] Appl. No.: 763,157

[22] Filed: Aug. 7, 1985

Related U.S. Application Data

[63] Continuation-in-part of Ser. No. 624,084, Jun. 25, 1984, abandoned.

[51] Int. Cl.$^4$ .......................... C08K 5/09; C08L 1/08; C04B 33/34
[52] U.S. Cl. ................... 523/351; 106/193 R; 106/198; 264/61; 264/63; 524/292; 524/356
[58] Field of Search ............... 106/193, 198; 264/61, 264/63; 427/126.2, 126.4; 523/351; 524/292, 356

[56] References Cited

U.S. PATENT DOCUMENTS

| | | | |
|---|---|---|---|
| 2,714,076 | 7/1955 | Seckel | 106/198 |
| 3,966,483 | 6/1976 | Albright | 106/198 |
| 3,977,887 | 8/1976 | McIntosh | 106/46 |
| 4,104,345 | 8/1978 | Anderson et al. | 264/43 |
| 4,109,377 | 8/1978 | Blazick et al. | 106/1.21 |
| 4,289,719 | 9/1981 | McIntosh | 264/61 |
| 4,313,900 | 2/1982 | Gonzales et al. | 264/61 |
| 4,369,154 | 1/1983 | Dougherty | 264/63 |

OTHER PUBLICATIONS

"Paint Flow & Pigment Dispersion", Patton, 2nd. Wiley-Interscience, 1979, Ch. 19, pp. 410–438.
ASTM Designation: D 2196-81, pp. 361–365.
"A Fabrication Technique for Multilayer Ceramic Modules", H. D. Kaiser et al, Solid State Technology, May 1972, pp. 35–40.
"Fabricating Ceramic Sheets for Multilayer Substrates", Swiss, Circuits Manufacturing, (3 pages).
"Forming Green Sheet Ceramic", McIntosh et al, IBM Technical Disclosure Bulletin, vol. 19, No. 3, Aug. 1976, pp. 945–946.
"Multi-Layer Ceramics Manufacturing", Burger et al, IBM J. Res. Develop., vol. 27, No. 1, Jan. 1983, pp. 11–19.

Primary Examiner—Theodore Morris
Attorney, Agent, or Firm—T. Rao Coca

[57] ABSTRACT

Disclosed is a method of forming a slurry for casting into ceramic green sheets. Starting from selected quantities of a solvent, plasticizer, polymeric binder material, frit and aluminum oxide, a low viscosity pre-mix is formed by combining predetermined portions of the solvent and binder material and all of the plasticizer. The remaining portions of the solvent and binder material are combined into a post-mix. Next, the pre-mix and frit are milled in a ball mill. Then the aluminum oxide is added to the ball mill in steps using predetermined portions and milled for predetermined periods of time to achieve the desired degree of aluminum oxide deagglomeration and particle packing density. Finally, the post-mix is added to the ball mill and milled to obtain the final slurry.

10 Claims, 2 Drawing Figures

STEPWISE/ULTIMATE DENSITY MILLING

This application is a continuation-in-part of Ser. No. 624,084 filed June 25, 1984, now abandoned.

BACKGROUND OF THE INVENTION

This invention relates to the production of flexible unfired ceramic green sheets which are used for lamination in a multilayer ceramic substrate, and more particularly, to a novel method of forming a ceramic slurry (also known as slip or paint) for casting into the green sheets.

Due to the high packing densities attainable with multilevel ceramic (MLC) substrate structures, they have achieved widespread acceptance in the electronics industry for packaging of semiconductor integrated devices. The general processes of fabricating a MLC substrate are well known in the art and are described in the publication entitled "A Fabrication Technique for Multilayer Ceramic Module", by H. A. Kaiser et al, Solid State Technology, May 1972, pp 35–40; IBM Technical Disclosure Bulletin entitled "Forming Green Sheet Ceramic" by C. M. McIntosh and A. F. Schmeckenbecher, Vol. 19, No. 3, pp 945-946, August 1976, and U.S. Pat. Nos. 3,899,554 and 4,109,377. The basic building block used in the MLC fabrication is the unfired ceramic green sheet, nominally 0.2 mm or 0.28 mm thick. A key factor in achieving acceptable MLC substrate yields is the formulation of a green sheet that exhibits the necessary strength for handling and processing and the necessary density and dimensional stability to ensure accurate plane-to-plane registration when the sheets are stacked and laminated. In addition, the green sheet must have sufficient compressibility and bond strength.

The green sheet properties are predominately dictated by the nature and composition of the slurry from which the green sheet is prepared. Specifically, green sheet density and fired shrinkage are controlled by the amount of deagglomeration of the slurry. To expound on this, the slurry is normally formulated in accordance with the prior art practice, from a ceramic particulate, a binder resin system and a solvent system. The function of the binder resin system is to provide adhesive and cohesive forces to hold the ceramic particulate together in its green sheet configuration. The solvent system is of volatile composition whose role is to dissolve the binder resin system into solution, to aid in uniformly mixing the binder resin with the ceramic particulate and to provide the necessary viscosity to the resultant ceramic paint for subsequent casting. The finely divided, low dielectric ceramic particulate forms the substrate material in the ultimately fired structure.

The ceramic particulate may be selected from a number of materials, depending on the property desired in the fired ceramic end product. Typical ceramic particulates include alumina, steatite, aluminum silicate, zirconium dioxide, titanium dioxide, magnesium silicate, bismuth stannate, barium titanate and their combinations.

The binder resin system will normally be comprised of a basic solvent soluble thermoplastic organic polymer having film forming properties which is nonvolatile at moderate temperatures but which will volatilize with other constituents of the resin system on firing of the green sheet to the final sintered state. Typical binders include polymethyl methacrylate, acrylates, polyvinyl acetate, polyvinyl butyral and nitrocellulose.

The binder resin system may contain other additives such as plasticizers which are soluble in the solvent mixture and which are volatilized during firing of the green sheet into its sintered state. The use of a plasticizer imparts flexibility to the polymer film and, in turn, to the green sheets to maintain it flexible, moldable and workable prior to firing. A wide range of plasticizers may be employed in the binder system and the selection may be made in accordance with techniques well known in the art.

The solvent system or mixture is a volatile fluid whose function is to completely dissolve the binder resin system into a "binder solution" to effect uniform mixing of the binder system with ceramic particulate, and to provide sufficient fluidity to the ceramic slurry for subsequent casting into a cohesive sheet.

The phrases "green sheet density" and "particle packing density" are used synonymously herein and refer to the final density of the cast ceramic green sheet.

The most versatile conventional method of forming a slurry is to thoroughly blend in a ball mill the ceramic particulate, binder resin and solvent system to coat the ceramic particulates with the binder resin and provide a smooth uniformly dispersed slurry. To elaborate on the details of the ball milling technique, attention is focused on a specific combination of basic materials for slurry preparation. The basic materials selected consist of alumina ($Al_2O_3$) and glass frit representing the ceramic particulate, methylisobutyl ketone and methyl alcohol representing the solvent system, and polymeric polyvinyl butyral in combination with a plasticizer, e.g. dipropylene glycol dibenzoate, representing the binder system. In the prior art method, all of the methyl isobutyl ketone, methyl alcohol and plasticizer and a small portion of the polyvinyl butyral are initially mixed into a liquid mixture having a suitable viscosity. Then, the liquid mixture and the glass frit, whose particle size is typically about minus 200 mesh or 9–11 m, are milled in a ball mill for a period of 4–8 hours to reduce the size of frit particles to about 3–3.5 m and form a new mixture. Next, the remaining portion of the dry, undissolved polymeric binder material and all of the alumina are added to the new mixture and the milling operation is continued for about 12–22 hours to disperse the alumina in the new mixture and form a slurry having a desired viscosity and a preferred particle packing density which translates into a green sheet density, upon casting of the slurry into green sheets, of about 2 grams/cc.

This conventional method has several shortcomings. First, since a large portion of the polyvinyl butyral is added in a dry, undissolved state to a fairly viscous medium, during the initial mixing, polyvinyl butyral folds over in such a manner that lumps of polyvinyl butyral having a core of dry polyvinyl butyral powder and an outer shell of dissolved or viscous polyvinyl butyral are formed. Due to the rolling, cascading, churning and grinding operation of the ball mill, these lumps of polyvinyl butyral in the presence of the alumina grinding media transform into large, inert armor coated type balls which fall to dissolve in the slurry even after an extended dispersion milling period. The formation of these inert balls deletriously affects the slurry viscosity, alters the milling efficiency of the ball mill and the batch of green sheets that are cast from the slurry will suffer from undesirable green sheet properties which will alter the sintered characteristics of the batch. Likewise, the next batch of green sheets that are cast from the next job of slurry that is prepared in the same ball mill will have undesirable characteristics due to an excess of polyvinyl butyral content which results from the dissolution of the polyvinyl butyral balls from the first batch in the liquid solvents of the second batch. Another shortcoming of the prior art method of slurry preparation is that since alumina is dispersed in a rather highly viscous mixture, minor variations in alumina deagglomerates, particle size and impurities, for e.g. due to lot-to-lot variations, cause significant variation in the milling efficiency and thereby cause a variation amount of deagglomeration that can be achieved which again translates into variation in the green sheet density and shrinkage upon sintering. Another drawback of the prior art process is that it is a rather time consuming process requiring 16-30 hours to prepare the slurry.

It would appear that one way of reducing or eliminating the above polyvinyl butyral ball formation problem is to physically separate the polyvinyl butyral particles and prevent their lumping together on initial contact with the solvent mixture by dispersing the polyvinyl butyral particles in the alumina i.e. dry blend the of polyvinyl butyral powder and all of the alumina particulate together and adding this combination to the ball mill containing the mixture of solvents, glass frit, etc. However, this procedure does not alter the effect of time dependent solubilization of the polyvinyl butyral which affects the rate of dispersion.

Accordingly, it is an object of this invention to provide a process of forming a slurry for casting into green sheets which is free of the above prior art process sensitivites.

Specifically, it is an object of this invention to provide a method of forming a green sheet casting slurry having a high degree of deagglomeration.

Another object of this invention is to provide an efficient milling process of forming a slurry for casting into ceramic green sheets.

It is a yet another object of this invention to provide a method of forming a ceramic slurry having stability and consistency not only within a given batch, but also from batch to batch.

SUMMARY OF THE INVENTION

The above objects and other related objects and advantages may be achieved by milling the basic ingredients of the slurry, stepwise, to ultimate density in a low viscosity liquid premix binder followed by the addition of a relatively high viscosity liquid post-mix. In a specific preferred embodiment, starting from the basic starting materials of a liquid solvent (e.g., methylisobutyl ketone and methanol), a resin plasticizer (e.g. dipropylene glycol dibenzoate), a polymeric binder material (e.g. polyvinyl butyral) and a ceramic particulate comprised of alumina and glass frit, a relatively low viscosity binder pre-mix is formed by combining, predetermined portions of the solvent and polymeric binder material and all of the plasticizer. The remaining portions of the solvent and the polymeric binder material are combined into a relatively high viscosity binder post-mix. Next, the glass frit part of the ceramic particulate is added to the pre-mix and milled in a ball mill for a period of time to reduce the size of the frit particles. Thereafter, the alumina is added stepwise, for example, in three predetermined portions, to the ball mill and milled for specific short periods of time to achieve the desired degree of deagglomeration. The first portion is milled to achieve complete deagglomeration and provide the maximum particle packing density. The second portion is to achieve a high level of deagglomeration, although not complete deagglomeration. The third portion is milled to a lower level of deagglomeration than that achieved by the second portion. The net effect of this stepwise milling is achieving, on the average, the necessary degree of alumina deagglomeration and thereby the necessary particle packing density in the final slurry. Finally, the liquid post-mix is added to the ball mill and milled for a short period of time to obtain a final slurry having the desired degree of deagglomeration, improved particle packing density, stability and consistency.

BRIEF DESCRIPTION OF THE DRAWINGS

The novel features and process steps characteristics of the invention are set forth in the appended claims. The invention, however, will be best understood by reference to the detailed description which follows in conjunction with the accompanying drawings, wherein

DETAILED DESCRIPTION OF THE PREFERRED EMBODIMENT

Figure 1:
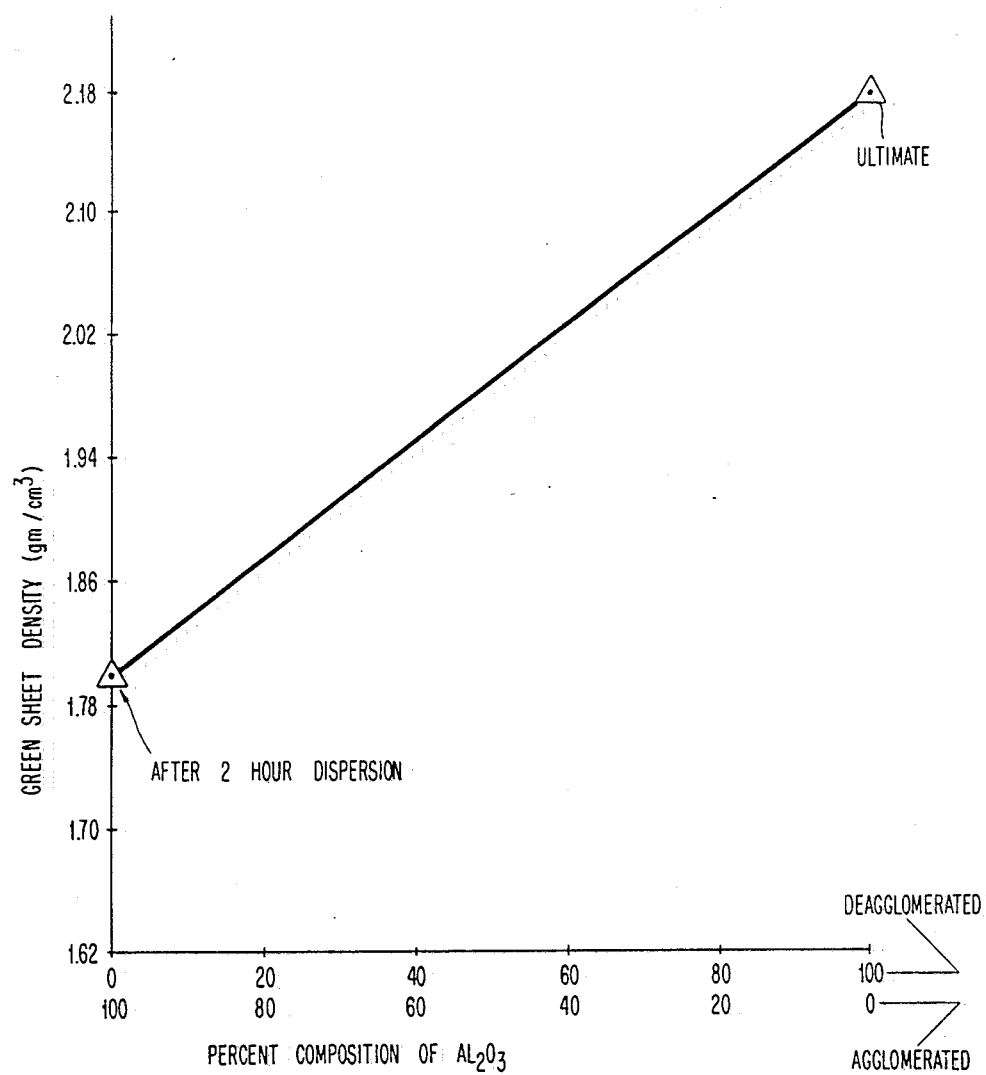
FIG. 1 is a graphical illustration showing the relationship between the particle packing density in the slurry and the proportion of the agglomerated and deagglomerated alumina therein.

All viscosities disclosed herein are those measured using ASTM (American Society of Testing Materials) standard having the designation D2196-81.

Unless otherwise specified, the herein disclosed process steps and their combination are accomplished at room temperature, typically about 25° C.

The invention in its broad aspects is in general applicable for use with all conventional ceramic formulations fabricated by usual techniques in which a ceramic slurry is cast into ceramic layers which are dried into self-supporting flexible green sheets for ultimate application, in final or fired form, as dielectric supports for printed circuits, insulation, capacitor components, other circuit elements (such as conductive paths, resistors, transistors, diodes, etc.) and the like, either as a single layer or multilayer support.

The ceramic slurry is formulated, in accordance with the invention, by starting from the basic raw materials presently employed in the art, depending on the property desired in the fired ceramic end product. The starting materials consist of liquid solvents (e.g. methylisobutyl ketone and methyl alcohol), a polymeric binder material (e.g. dry, powdered polyvinyl butyral), a resin plasticizer (e.g. dipropylene glycol benzoate) and a ceramic particulate consisting of a large quantity (e.g. about 85%–95%) of aluminum oxide and a small quantity (5%–15%) of glass frit. The glass frit may be of the magnesia-calcia-alumina-silica glass variety consisting of 52% of $SiO_2$, 30% of $Al_2O_3$, 8.5% of CaO, 8.5% of MgO and less than 1% of impurities by weight. The first step of the present process is forming a liquid pre-mix by combining a predetermined portion (e.g. 50%) of the liquid solvents, all of the plasticizer and a predetermined portion (e.g. 2%–25%) of the total polyvinyl butyral binder material to achieve a low viscosity of about 2-8 cps. The lower viscosity limit corresponding to a smaller percent of polyvinyl butyral content. Below a pre-mix viscosity of 2 cps the polyvinyl butyral content will not be sufficient to provide complete steric stabilization of the alumina and frit particles that will be subsequently added to the pre-mix. Above a pre-mix viscosity of 8 cps the pre-mix becomes rather highly viscous and thereby lowers not only the milling efficiency, but also the ability to mix the alumina powder in the pre-mix.

The remaining portions of the solvents and the binder material are combined separately into a post-mix for subsequent use. Since the post mix generally contains a proportionately larger quantity of the dry polyvinyl butyral binder material than the pre-mix in approximately the same quantity of liquid solvents, the viscosity of the post-mix will be relatively higher than that of the premix, in the range of 3,000-30,000 cps. For example, when 50% of the liquid solvents are combined with 88% of the polymeric binder, material the viscosity of the resulting post-mix would be about 15,000 cps.

The next step in the present process of forming a ceramic slurry is adding all of the glass frit and the pre-mix to a ball mill and grinding to reduce the size of the frit particles. The frit particles generally employed have a size, typically, of the order of 10 m. Upon grinding the frit in the low viscosity pre-mix in the ball mill for about 2-3 hours the frit particles are reduced to a size of about 5 m. Further reduction of the frit particle size to a size of about 3-3.5 m will take place in subsequent ball milling steps.

The next sequence of process steps comprises stepwise milling of the alumina by combining it with the pre-mix and glass frit mixture to achieve a desired particle packing density in the resultant intermediate mixture product. The density of the alumina in the finely powdered form is about 1.0 gram/cc compared to the theoretical density of solid alumina of about 3.96 grams/cc. Thus, a significant volume of the alumina in the powdered form is air. In order to make a fluid mixture of the alumina, the air is displaced, in this process, with the liquid solvent contained in the pre-mix and frit mixture. Since the full 100% of the liquid solvents are not available for dispersing the alumina therein by virtue of the fact that a portion (nearly 50%) of the solvents are utilized in the post-mix, the alumina is added to the pre-mix and glass frit mixture in three predetermined portions.

Figure 2:
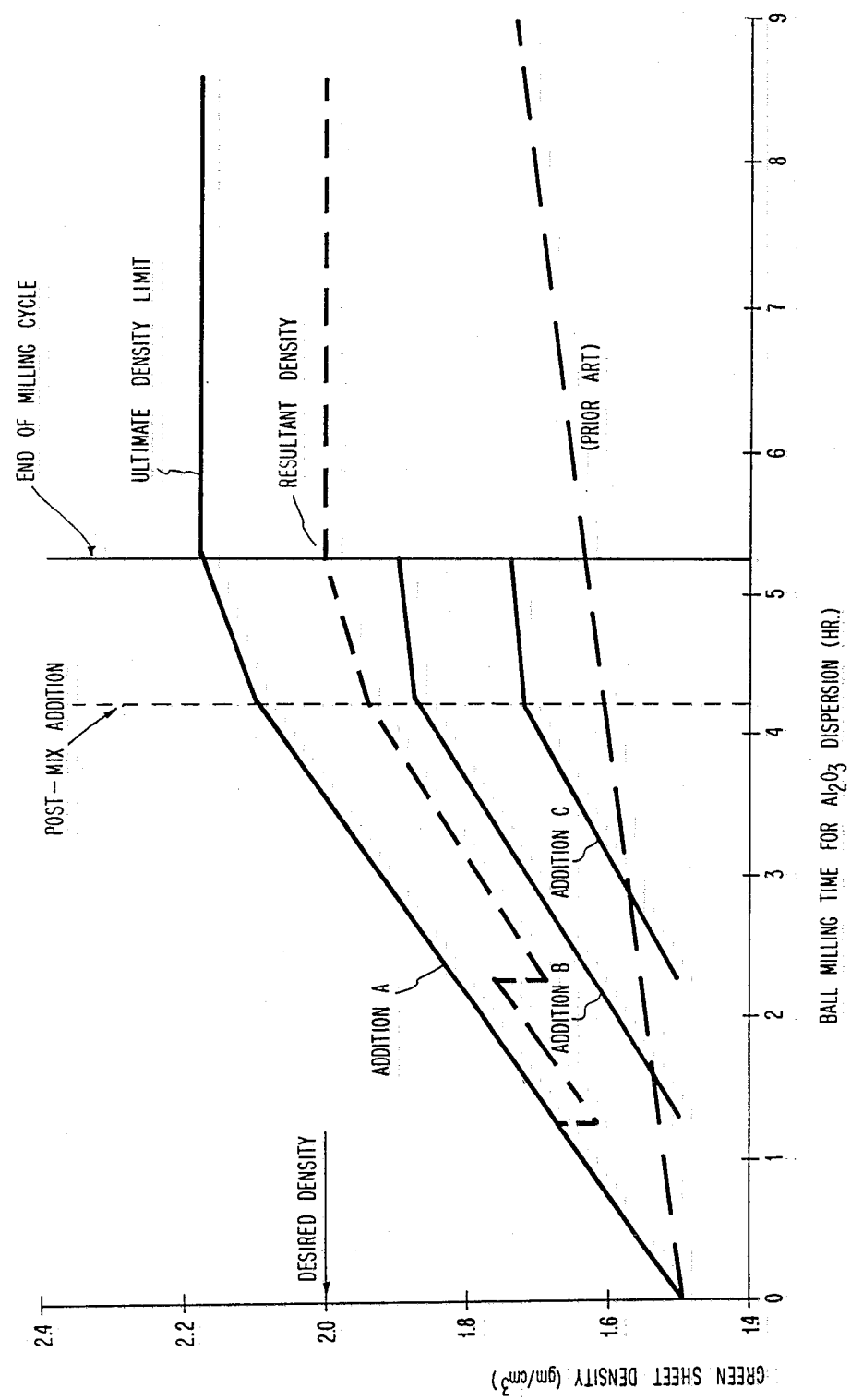
FIG. 2 is a graphical illustration showing the variation of the particle packing density in the slurry as a function of the dispersion milling time in accordance with the present invention and in accordance with the prior art.

In one example of the stepwise milling sequence, first a predetermined major portion, for example, about 50% of the total alumina is added to the ball mill and milled for about 1.25 hours. As illustrated in FIG. 2 the alumina particle packing density in the powdered alumina prior to addition to the ball mill, which is close to 1 gram/cc, will rise immediately upon addition (Addition A in FIG. 2) to the contents of the mill to approximately 1.5 grams/cc regardless of the degree of deagglomeration of the alumina. Upon milling, the packing density will gradually rise with time until a saturation or ultimate packing density of about 2.2 gram/cc is attained after about 5 hours beyond which the density will not rise. This state of affairs corresponds to complete deagglomeration (FIG. 1) of the alumina in the new mixture product of the pre-mix, glass frit and 50% alumina. Since in the first step of the stepwise milling sequence, the 50% portion of the alumina is milled for only 1-1.5 hours, the packing density will although have not reached the ultimate density the alumina particles will pack to a level leaving sufficient quality of liquid solvents to accept more dry alumina powder.

In the second step of the stepwise milling sequence, a second predetermined portion which is smaller than the first predetermined portion, for example, 25%, of the alumina is added to the ball mill and milled to disperse the alumina in the liquid solvents available in the ball mill by milling for about an hour. During this second stepwise milling step, the liquid solvents left over from the previous step will fill the voids present in the newly added alumina powder and enable a suspension of the second portion of alumina. The packing density of the second portion (Addition B) of alumina will rise, with time as illustrated in FIG. 2. Simultaneously, due to the continuous further dispersion, the packing density of the first portion (Addition A) of the alumina will rise further as also illustrated in FIG. 2. At the completion of this second step of the stepwise milling sequence, owing to the tight packing of the alumina particles of the first portion and close packing of the alumina particles of the second portion, a quantity of excess liquid solvents will be available for dispersion therein of the remainder of the alumina.

In the third step of the stepwise milling sequence, the remaining portion, i.e. 25% of the alumina powder is added to the ball mill and milled for about 2 hours. In this step several events take place. The packing density of the third portion (Addition C) of the alumina will rise, as illustrated in FIG. 2, to a value higher than 1.5 grams/cc. The density of the second portion (Addition B) of alumina will rise further, due to additional deagglomeration that this portion is subjected to. Finally, the density of the first portion (Addition A) of alumina will reach the ultimate density level since by the end of the present step the first portion (Addition A) has been subjected to dispersion milling in excess of 4 hours which approaches the normal milling time for achieving complete deagglomeration when alumina is added to an all liquid solvent. The slopes of the FIG. 2 graphs corresponding to the three portions of alumina are different because of the differences in the viscosity of the mixtures involved. As the viscosity increases, which is precisely what happens as more and more of alumina is added to the ball mill, more energy or a longer time is necessary to disperse the alumina.

The effect of the above three step milling is as follows: Referring to FIG. 2, the first major portion (Addition A) of the alumina is milled in the pre-mix and frit mixture of complete deagglomeration or to an ultimate density of about 2.2 grams/cc. The second portion (Addition B) of the alumina is milled to a high degree of deagglomeration in the range of 50%-60% or to a density of about 1.9 grams/cc. The third portion (Addition C) of the alumina is milled to about 30%-40% deagglomeration or a packing density of about 1.7-1.8 grams/cc. The net effect of the above three effects is that the alumina is deagglomerated to about 70%-80% level thereby (FIG. 1) providing a particle packing density of close to the desired value of about 2.0 grams/cc. In other words, the agglomerates left over in the second and third portions bring the density of the completely deagglomerated first portion to a net value of 2.0 grams/cc.

Once the desired packing density is achieved, the post-mix is added to the contents of the ball mill which are essentially in a liquid state and milled to obtain the final slurry consisting of mostly primary particles and a few agglomerates and having the desired final, particle packing density. Since the alumina particles have been predispersed in liquid solvents, this final step of slurry formation involving mixing of two liquids takes place rather quickly, in less than about 1 hour.

While the above three-step stepwise milling discloses adding alumina to the pre-mix and glass frit mixture in portions (Portions A, B, C) of 50%, 25% and 25% of the total alumina and milling prior to adding the next portion for 1.25 hour, 1 hour and 2 hours, respectively, followed by post-mix milling for about an hour, other combinations may be quite conveniently used. For example, the portions A, B, and C may be 60%, 20% and 20% and the corresponding milling times may be 2.5 hours, 1 hour and 1 hour, respectively, with a post-mix milling period of about 0.75 hour. A third example is portions of 40%, 35% and 25% and corresponding milling times, in hours of, 1, 2.5 and 1, respectively, in combination with post-mix milling time of about 0.75 hour. In general, the preferred ranges for the three portions in a three-step milling process and their corresponding milling times are as follows:

| Portion | % of Alumina | Alumina Milling Time |
|---|---|---|
| Portion A | 40–60 | 1–2.5 hours |
| Portion B | 25–35 | 12.5 hours |
| Portion C | 15–25 | 0.25–2 hours |

The preferred post-mix milling times are in the range of 0.25–3 hours.

The particular combination of the portions A, B, and C and their corresponding milling times, etc, are selected such that the cumulative effect of each addition and milling of alumina results in a desired particle packing density.

The present process offers several advantages over the conventional processes. The milling of the various ingredients of the ceramic slurry takes place at a high efficiency since all of the milling occurs at a relatively low viscosity. Compared to the prior art processes which require a milling time of 16–30 hours, the present milling time is about 6–7 hours. In other words, this process reduces the milling cycle period by about 70%. The slurry will be stable (i.e. in a steady state) and consistent since a large portion of the alumina is milled to completion. This process permits excellent control of the particle packing density in the slurry, as illustrated in FIG. 1, by enabling tight control over the percent composition of alumina agglomerates that are dispersed in the slurry in the last step of the stepwise milling sequence. Since the alumina added during the first and second steps of stepwise milling sequence are essentially completely deagglomerated and the alumina added in the third step to introduce deagglomerates is only a small portion of the total alumina careful adjustment of the slurry density, etc., to the desired specification becomes possible by manipulating this small portion of alumina. In other words, this process is not prone to procedural fluctuations and lot variations.

In accordance with one specific example of this invention, a uniform, high density ceramic slurry was prepared by ball milling together with the following constituents, in parts by weight:

| Pre-mix | |
|---|---|
| Solvent System | |
| Methanol | 3,670 gm |
| Methylisobutyl ketone | 11,095 gm |
| Binder Resin System | |
| Dipropylene glycol dibenzoate | 1,087 gm |
| Polyvinyl butyral | 446 gm |
| Post-mix | |
| Solvent System | |
| Methanol | 3,388 gm |
| Methylisobutyl ketone | 10,241 gm |
| Binder Resin System | |
| Polyvinyl butyral | 3,394 gm |
| Ceramic Particulate | |
| Ceramic Powder | |
| Alumina (Al$_2$O$_3$ av. particle size: —400 mesh) | 50,360 gm |
| Glass Frit | 6,225 gm |

After preparing the binder pre-mix and post-mix using the above indicated ingredients, the glass frit was milled in the pre-mix for 3 hours to reduce the particle size to about 5 m. Then, three additions of alumina in batches of 50%, 25% and 25% were made to the ball and milled for dispersion milling periods of 1.25 hour, 1 hour and 2 hours, respectively. Finally, the post-mix was added and dispersed for 1 hour. The final slurry was smooth (of viscosity 2,000 cps) consisting of essentially discrete particles. The green sheet obtained had a density of 2.00 grams/cc.

While the invention has been described in conjunction with a specific preferred embodiment, it is evident that many alternatives and variations will be apparent to those skilled in the art in light of the foregoing description. For example, while the process has been described in connection with stepwise milling involving three steps, any number of steps more than two would be quite suitable to achieve the desired alumina deagglomeration. It is therefore contemplated that the appended claims embrace any such alternatives, modifications and variations as fall within the true scope and spirit of the invention.

What is claimed is:

1. A method of forming a slurry for casting into a ceramic sheet from predetermined quantities of an organic solvent, a solvent soluble polymeric binder material, a resin plasticizer and a ceramic particulate consisting in separated parts of aluminum oxide and glass frit, said method comprising;
   (a) forming a relatively low viscosity pre-mix having a viscosity in the range 2–8 cps by combining a predetermined portion of the solvent, all of the plasticizer and a predetermined portion of said binder material;
   (b) forming a relatively high viscosity post-mix having a viscosity in the range 3,000–30,000 cps by combining the remaining portions of said solvent and said binder material;
   (c) mixing the glass frit in said pre-mix;
   (d) dispersing the aluminum oxide in the glass frit and pre-mix mixture and forming an intermediate slurry by adding the aluminum oxide, stepwise, in predetermined portions and mixing for predetermined periods of time; and
   (e) combining said post-mix with said intermediate slurry.

2. A method of forming a ceramic slurry by milling in a ball mill selected quantities of a solvent, a polymeric binder material, a plasticizer, aluminum oxide and glass frit, said method comprising:
  (a) forming a pre-mix of a relatively low viscosity in the range 2-8 cps by combining a predetermined portion of the solvent, said plasticizer and a predetermined portion of said binder material;
  (b) forming a relatively high viscosity post-mix by combining the remaining portions of the solvent and binder material;
  (c) adding said pre-mix and the glass frit to said ball mill and milling to reduce the size of the frit particles;
  (d) adding aluminum oxide to said ball mill in a series of steps, in predetermined portions, and milling for predetermined periods of time to disperse the aluminum oxide and obtain in intermediate slurry having a high degree of aluminum oxide deagglomeration; and
  (e) adding said post-mix to said intermediate slurry and milling to form said ceramic slurry.

3. The method as in claim 1 or 2 wherein said solvent is a mixture of methylisobutyl ketone and methyl alcohol.

4. The method as in claim 3 wherein said plasticizer is dipropylene glycol dibenzoate.

5. The method as in claim 3 wherein said binder is selected from a group consisting of polyvinyl butyral, polyvinyl chloride and polyvinyl acetate.

6. The method as in claim 5, wherein said glass frit comprises approximately 52% of silicon dioxide, 30% of aluminum oxide, 8.5% of calcium oxide, 8.5% of magnesium oxide and less than 1% of impurities by weight.

7. The method as in claim 6 wherein said predetermined portion of the solvent is about 50 percent of the solvent.

8. The method as in claim 7 wherein said predetermined portion of binder material is in the range of about 2%-25% of said quantity of binder material.

9. The method as in claim 8 wherein said predetermined portions of aluminum oxide consist of three portions in the range of 40%-60%, 25%-35% and 15%-25% of said quantity of aluminum oxide.

10. A method of forming a slurry for casting into ceramic substrates starting from selected quantities of a solvent, plasticizer, polymeric binder, powdered aluminum oxide and frit, said method comprising:
  (a) forming a pre-mix by combining about 50% of the solvent, all of the plasticizer and about 25% of the binder;
  (b) forming a post-mix by combining the remaining quantities of solvent and said binder;
  (c) mixing the pre-mix and frit in a ball mill;
  (d) adding to the mixture of frit and pre-mix a first portion of about 50% of said aluminum oxide and milling for a first period of about 1.25 hours forming a first resultant mixture, adding a second portion of about 50% of the remaining aluminum oxide to said first resultant mixture and milling for about an hour forming a second resultant mixture and adding a third portion consisting of the remaining aluminum oxide to said second resultant mixture and milling for about 2 hours to form a third resultant mixture whereby said first portion of aluminum oxide is milled to near complete deagglomeration for a total time of about 4.25 hours, said second portion of aluminum oxide is milled to about 50%-60% deagglomeration for a total time of about 3 hours and said third portion is milled to about 30%-40% deagglomeration; and
  (e) combining said third resultant mixture and said post-mix.

* * * * *